United States Patent [19]

Kato et al.

[11] 4,393,573

[45] Jul. 19, 1983

[54] METHOD OF MANUFACTURING SEMICONDUCTOR DEVICE PROVIDED WITH COMPLEMENTARY SEMICONDUCTOR ELEMENTS

[75] Inventors: Kotaro Kato, Chofu; Tetsuma Sakurai, Hachioji, both of Japan

[73] Assignee: Nippon Telegraph & Telephone Public Corporation, Tokyo, Japan

[21] Appl. No.: 181,357

[22] Filed: Aug. 26, 1980

[30] Foreign Application Priority Data

Sep. 17, 1979 [JP] Japan .................................. 54/117873
Mar. 4, 1980 [JP] Japan .................................. 55/26177
Apr. 14, 1980 [JP] Japan .................................. 55/48555

[51] Int. Cl.³ ........................................ H01L 21/223
[52] U.S. Cl. .................................. 29/571; 29/576 E; 29/576 W; 29/578; 29/580; 148/175; 148/187; 156/662
[58] Field of Search ............... 29/576 E, 576 W, 580, 29/571, 578, 577 C; 148/175, 187; 156/662

[56] References Cited

U.S. PATENT DOCUMENTS

| | | | |
|---|---|---|---|
| 3,189,973 | 6/1965 | Edwards et al. | 148/175 X |
| 3,312,879 | 4/1967 | Godejahn | 29/576 W |
| 3,453,498 | 7/1969 | Hubner | 148/175 X |
| 3,461,003 | 8/1969 | Jackson | 148/175 |
| 3,507,713 | 4/1970 | Kravitz | 148/175 |
| 3,508,980 | 4/1970 | Jackson et al. | 148/175 |
| 3,509,433 | 4/1970 | Schroeder | 29/578 X |
| 3,818,583 | 6/1974 | Polata | 29/578 |
| 3,826,699 | 7/1974 | Sawazaki et al. | 29/578 X |
| 3,938,176 | 2/1976 | Sloan | 148/175 X |
| 4,283,235 | 8/1981 | Raffel et al. | 148/175 |

OTHER PUBLICATIONS

Lee, J. of Applied Physics, vol. 40, No. 1, Oct. 1969, pp. 4569-4574.

*Primary Examiner*—G. Ozaki
*Attorney, Agent, or Firm*—Charles E. Pfund

[57] ABSTRACT

The semiconductor device is provided with semiconductor elements having the complementary characteristics and high breakdown strength. These semiconductor elements are formed in N and P islands respectively each having an inverted frustum shape.

Surfaces of the frustum are inclined by an angle determined by semiconductor crystal structure. Side and bottom surfaces of the islands are formed adjacent to an insulating layer and both islands are supported part from the polycrystalline semiconductor layer. All side and bottom surfaces of the islands adjacent the insulating layer are made of high impurity substance of the same type as respective islands.

5 Claims, 25 Drawing Figures

METHOD OF MANUFACTURING SEMICONDUCTOR DEVICE PROVIDED WITH COMPLEMENTARY SEMICONDUCTOR ELEMENTS

BACKGROUND OF THE INVENTION

This invention relates to a complex semiconductor device, more particularly a semiconductor device incorporated with semiconductor elements having complementary characteristic through a dielectric isolating structure.

Various types of the semiconductor devices of the type just mentioned have been developed for use in various applications. Although, semiconductor devices having satisfactory characteristics for certain applications have been developed, semiconductors having satisfactory characteristics for different applications have not yet been developed. For example, as a result of recent development in the art of electronics, modern telephone exchange equipments are fabricated with electronic elements, and time division type electronic telephone exchange equipments have been developed for the purpose of improving efficiency and satisfying various service requirements. Although such electronic telephone exchange equipments are advantageous in that they can meet various service requirements and can be applied directly to digital transmitting systems without requiring any special processing, their cost of manufacturing is considerably higher than the prior art telephone exchange equipment. The reason for increasing the manufacturing cost lies in that it is necessary to provide a bidirectional talking supply current, a rate pulse, etc. to subscriber lines for respective subscribers. Since such supply circuit supplies to the lines a large current of 120 mA, for example, it is necessary to fabricate, with integrated circuit technique, switching transistors utilized to switch such large current sufficient to withstand high voltage, for example 240 V, and to have excellent complementary characteristics.

The following are some of the prior art transistors suitable for such applications. U.S. Pat. No. 3,818,583 discloses complementary transistors in which an N− island and a P island are isolated by a dielectric by unique combination of a selective diffusion of a P+ impurity into an N− substrate, a passivation of islands with oxidized film and a vapor deposition of thick polycrystalline silicon film.

With this construction, it is easy to form an N type transistor having a breakdown strength of about several hundreds volts in the N− island, since the impurity concentration in the N− island is made to be $5 \times 10^{14}/cm^3$, for example. However, it is impossible to obtain a P type transistor having a high breakdown strength, because the P island is formed by heat diffusion of a P type impurity into the N− substrate, thus failing to sufficiently decrease the impurity concentration. Moreover, with this construction, high impurity concentration layer can be formed only on the bottom surface of the N− island with the result that a relatively large series resistance is added to the transistor formed in the N− island, thus narrowing the dynamic operating range of the transistor. Furthermore, heat treatment at a high temperature over a long time is necessary to form the P island by heat diffusion of a P type impurity into the N− substrate which is of course undesirable from the standpoint of manufacturing cost.

Furthermore, U.S. Pat. No. 3,461,003 discloses a construction in which the N− island and the P− island are selectively formed by epitaxial growth technique and in which respective islands are surrounded by a dielectric and supported by polycrystalline silicon. With this construction, since respective islands are formed with epitaxial growth technique, it is not only possible to control the impurity concentration in respective islands to any desired value but also possible to make high the impurity concentration of the portions of the islands contiguous to the dielectric, thereby attaining complementary transistors having a high breakdown strength and a low resistance. With this construction, however, as respective islands are formed by selective epitaxial growth technique, the cross-sectional configuration of respective islands becomes rectangular of an inverted frustum, thus making it difficult to control its shape, or the formation of the vertical walls. The polycrstalline layers between respective islands would not be formed in the vapor deposition process sufficiently near the side walls, particularly near the bases of these islands since they have vertical or overhung walls, thus forming cavities of recesses which cause the fracture of the wafer.

Furthermore, in this construction, the range of conditions of the selective epitaxial growth is narrow, thus makes it difficult to control processes. With this construction, it is extremely difficult to form thick islands having a thickness of several tens microns.

During the photoetching step for forming a P island subsequent to the formation of an N island, it is difficult to correctly control photoetching due to the presence of a large shoulder caused by the N island.

SUMMARY OF THE INVENTION

Accordingly, it is the principal object of this invention to provide a semiconductor device provided with complementary semiconductor elements on a substrate, and a method of manufacturing such a semiconductor device.

Another object of this invention is to provide a method of manufacturing, at a high reproduceability, complementary semiconductor elements on a substrate.

Still another object of this invention is to provide a method of manufacturing a semiconductor device provided with complementary semiconductor elements by a unique combination of the steps of conventional method of manufacturing a semiconductor device without relying upon any special treatment.

A further object of this invention is to provide a method of manufacturing a semiconductor device provided with complementary semiconductor elements not requiring any special strict process control.

Still further object of this invention is to provide a method of manufacturing a semiconductor device provided with complementary semiconductor elements which does not cause fracture of the substrate due to recesses on the surface of the elements.

According to one aspect of this invention there is provided a semiconductor device having complementary semiconductor elements comprising a P type single crystalline semiconductor island; an N type single crystalline semiconductor island; a polycrystalline semiconductor layer surrounding the single crystalline semiconductor island to define a common major plane together with major plane, of the single crystalline semiconductor layers, a polycrystalline semiconductor layer supporting the single crystalline semiconductor island in an isolated state; an insulating layer disposed between side and bottom surfaces of respective single crystalline semiconductor layers and the polycrystalline layer; P and N type high impurity layers formed at portions of respective single crystalline semiconductor layers adjacent to the insulating layers, each of the single crystalline semiconductor layers having inclined side surfaces with angles determined by crystal structures thereof, and semiconductor element having complementary characteristics and respectively formed in the single crystalline semiconductor island.

Accordingly to another aspect of this invention there is provided a method of manufacturing a complex semiconductor device comprising the steps of applying a first mask layer onto one major surface of a semiconductor substrate except a first local region, the first mask layer including a film having a first etching speed; forming a first semiconductor layer of a first conductive type on the entire surface of the substrate by an epitaxial growth process, the first semiconductor layer including a single crystalline layer grown from a first local region of the semiconductor substrate, and a polycrystalline layer grown from the the first mask layer; forming a second mask layer on a portion of the first semiconductor layer corresponding to the first local region, the second mask layer having a second etching speed faster than the first etching speed; etching the first semiconductor layer by using the second mask layer so as to leave only the single crystalline layer having inclined surfaces determined by a crystal structure of the single crystalline layer; removing the second mask layer; forming a layer containing an impurity of the first conductive type at a high concentration over the entire outer surface of the single crystalline layer; forming a first insulating layer on the single crystalline layer; removing the first mask layer; forming a second semiconductor layer of a second conductive type over the entire surface of the substrate by epitaxial growth process, the second semiconductor layer including a polycrystalline layer grown from the first insulating layer and a single crystalline layer grown from the semiconductor substrate; selectively forming a third mask layer on the single crystalline layer of the second semiconductor layer; etching the second semiconductor layer by using the third mask layer so as to leave a single crystalline layer of the second semiconductor layer on a second local region of the semiconductor substrate thereby forming inclined surfaces determined by crystal structure of the semiconductor substrate; removing the third mask layer; forming a layer containing a high concentration impurity of the second conductive type on entire outer surface of the remaining single crystalline layer of the second semiconductor layer; forming a second insulating layer on a surface containing the remaining single crystalline layer of the second semiconductor layer; forming a polycrystalline semiconductor layer on the surfaces; removing the semiconductor substrate; and forming semiconductor elements having complementary characteristics in respective exposed single crystalline layers by utilizing a surface formed by cutting as a major plane.

BRIEF DESCRIPTION OF THE DRAWINGS

In the accompanying drawings.

DESCRIPTION OF THE PREFERRED EMBODIMENTS

Figure 1:
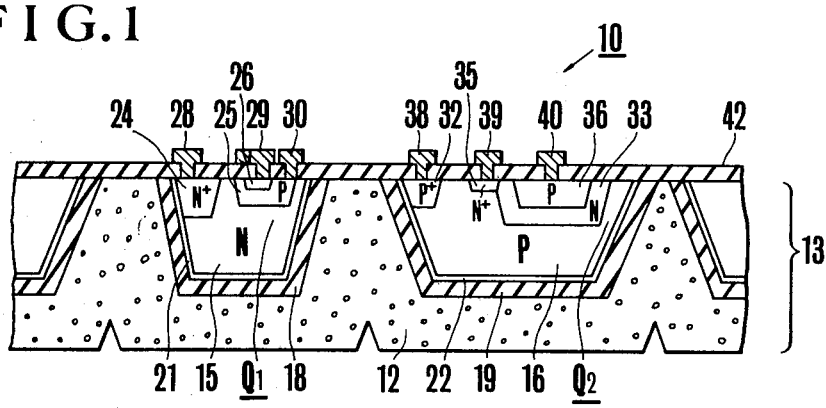
FIG. 1 is a sectional view showing one embodiment of a semiconductor device provided with complementary semiconductor elements according to this invention.

A preferred embodiment of a semiconductor device 10 shown in FIG. 1 comprises a semiconductor substrate 13 utilizing a polycrystalline layer 12 having a thickness of about 200 microns as a base. The polycrystalline semiconductor 12 is not required to be doped with any impurity. It is important to determine the deposition temperature by taking into consideration the heat treatment to be performed in the subsequent steps of manufacturing the elements. According to one embodiment, the deposition temperature is about 1,100° C. On one side of the semiconductor substrate 13 are closely arranged an N type single crystalline semiconductor region or island 15 containing phosphorus at an impurity concentration of $5 \times 10^{14}/cm^3$ and a P type semiconductor region or island 16 containing boron at an impurity concentration of $7 \times 10^{14}/cm^3$. Each one of these islands 15 and 16 has a substantially square configuration and all side surfaces and bottom surfaces of these islands in the polycrystalline semiconductors 12 are surrounded by insulating layers 18 and 19 having a thickness of 2 microns, for example. The insulating layers 18 and 19 are made of $SiO_2$, for example. These islands 15 and 16 have N+ and P+ semiconductor layers 21 and 22 formed adjacent the insulating layers 18 and 19 to a thickness of 15 microns, the impurity concentration of the portions of the layers 21 and 22 adjacent the insulating layers 18 and 19 being increased to $1 \times 10^{20}/cm^3$, for example. The side surfaces of the islands comprise (111) inclined surfaces converging from the top surface to the bottom and formed by etching. Where the single crystalline semiconductor regions 15 and 16 comprise (100) surfaces, the angle of inclination of the inclined surfaces is about 54° with respect to the main surface of the semiconductor substrate. This inclination angle is determined by the crystal structure of the semiconductor. Where the planes of the islands 15 and 16 have a configuration other than square, the inclined surface is constituted by ($\bar{2}11$), ($2\bar{1}1$), ($21\bar{1}$) and (211) planes in addition to the (111) plane, and these planes make an angle of about 71° with respect to plane (100). The inclined planes of a single crystalline semiconductor formed by etching is disclosed in a paper of D. B. Lee entitled "Anisotropic Etching of Silicon", JOURNAL OF APPLIED PHYSICS, Vol. 40, No. 11, pages 4569–4574, published in Oct. 1969.

On the surface of the N region 15 are formed by diffusion an N+ collector contact region 24, a P type base region 25, and an N type emitter region 26, and a collector electrode 28. A base electrode 30 and an emitter electrode 29 are connected to these regions respectively, to constitute a NPN type bipolar transistor $Q_1$. In the same manner, on the surface of the P type region 16 are formed by diffusion a P+ type collector contact region 32, an N type base region 33, N+ type base contact region 35 connected therewith, and a P type emitter region 36, and a collector electrode 38, a base electrode 39 and an emitter electrode 40 are connected to these regions respectively to constitute a PNP type bipolar transistor $Q_2$. Transistors $Q_1$ and $Q_2$ are covered by insulating oxide film 42.

The construction described above has the following advantages.

Thus, the main portions of the P, N islands are constituted by high resistance regions having a low impurity concentration and a uniform concentration and since high impurity concentration layers are disposed adjacent to the insulating layer, it is possible to make sufficiently small the values of resistance formed in the islands. As a consequence, it is possible to form semiconductor elements of the complementary characteristic in the P type and N type islands. Moreover, the resulting semiconductor elements have a high breakdown strength.

All side walls of the P and N type islands are inclined at angles determined by the structure of the semiconductor crystal comprising these regions. In other words, as the dimensional accuracy of these regions is not determined by mask technique, it is possible to prepare complementary regions having more uniform characteristics than the prior art elements.

Figure 2A:
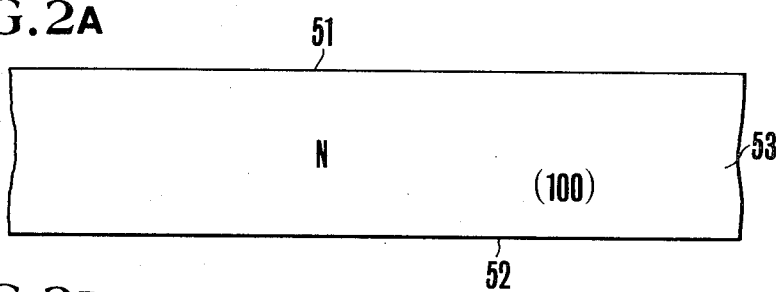
FIGS. 2A through 2R show successive steps of one example of the method of manufacturing the semiconductor device shown in FIG. 1.

The method of manufacturing the semiconductor device shown in FIG. 1 will now be described with reference to FIGS. 2A through 2R.

At first an N type silicon semiconductor substrate 53 is prepared, having an impurity concentration of $5 \times 10^{14}/cm^3$, for example, and (100) plane. The substrate has two opposing major surfaces 51 and 52, as shown in FIG. 2A.

Figure 2B:
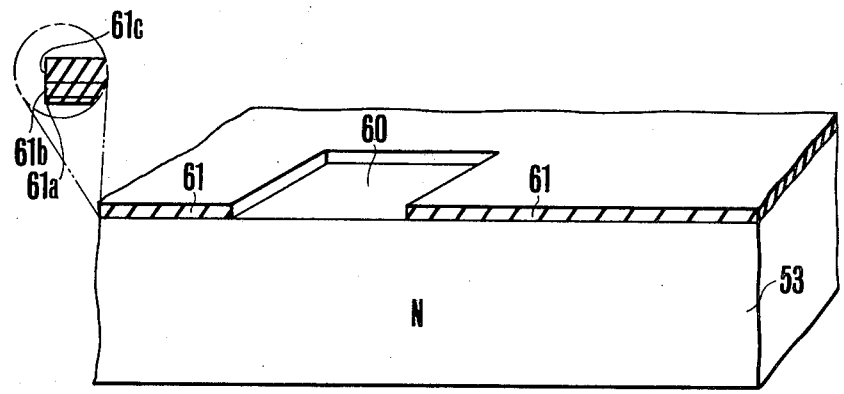

Then, as shown in FIG. 2B, the major surface 51 is covered by a mask layer 61 of 7000 Å except a plurality of local regions 60 of $300 \times 300$ microns, for example. The mask layer 61 may include a silicon nitride film, for example. As shown in an enlarged view shown in FIG. 2B, the mask layer 61 comprises a three layered construction comprising a silicon oxide film 61a having a thickness of 500 Å, a silicon nitride film 61b having a thickness of 1500 Å and a silicon oxide film 61c having a thickness of 5000 Å which are laminated in the order mentioned. The purpose of the silicon oxide film 61a adjacent the semiconductor substrate 53 is to absorb the stress created in the silicon nitride film 61b at the time of heat treatment, whereas the purpose of the silicon oxide film 61c on the silicon nitride film 61b is to prevent the silicon nitride film 61b from being removed by an alkaline etching solution to be described later.

Figure 2C:
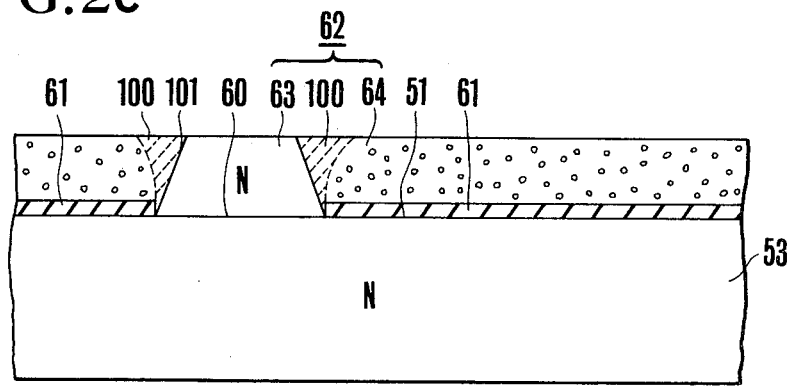

Then, as shown in FIG. 2C, on the surfaces of the mask layer 61 and substantially square shaped exposed region 60 of the substrate 53 are formed an epitaxially grown layer 62 containing such N type impurity as phosphorus and having a thickness of 50 microns. This thickness is selected such that a desired breakdown strength can be provided for the junction between the base and collector electrodes of the transistors to be formed in the epitaxially grown layer 62. According to epitaxial growth process it is possible to increase this thickness. Since the portion 63 on the region 60 of the layer 62 has been grown from the single crystalline semiconductor substrate 53 the portion 63 is of course single crystalline, whereas since the portion 64 on the mask layer 61 has been grown on the mask layer 61 it is not single crystalline but polycrystalline. An interface region 100 shown by dotted lines between portions 63 and 64 has the same or substantially the same crystal axis as the portion 63 but has a poor crystalline structure. The interface 101 between the interface region 100 and the portion 63 coincides with the (111) plane of the portion 63.

Figure 2D:
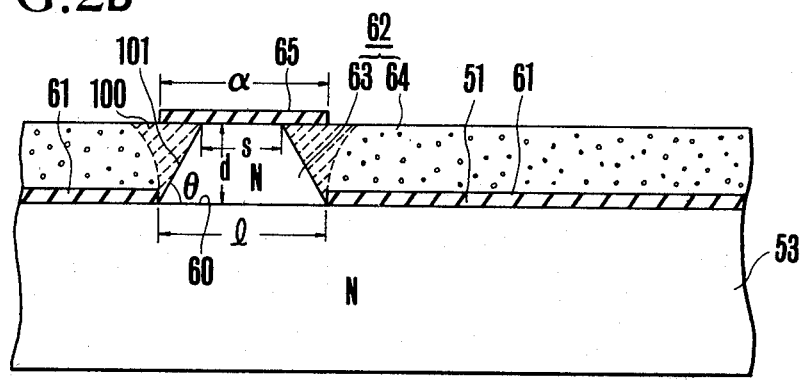
Figure 2E:
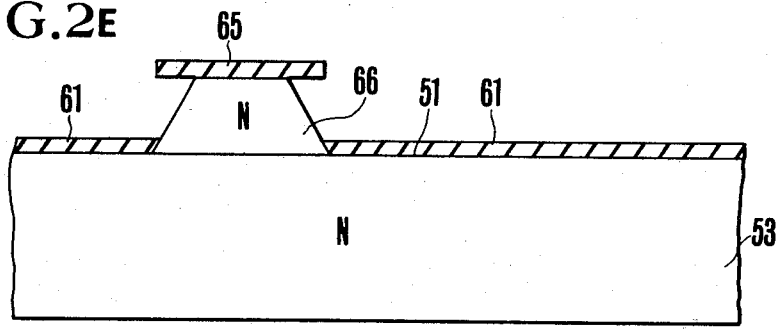
Figure 2F:
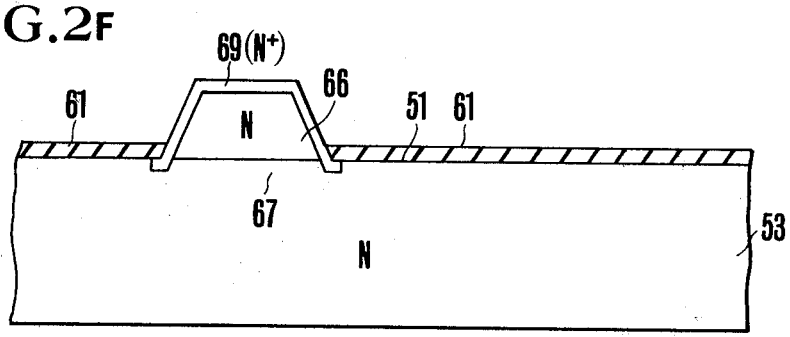

Then, as shown in FIG. 2D, a square mask layer 65 containing a silicon oxide film is applied onto the portion 63 of the layer 62 and then the layer 62 is anisotropically etched by using the mask layer 65 and an etchant consisting of 30 wt % of KOH aqueous solution and isopropyl alcohol at a temperature between 75° C. and 80° C. to remove portions other than a semiconductor layer 66 beneath the mask layer 65 on the region 60 of the portion 63, as shown in FIG. 2E. The alcohol contained in the anisotropic etchant operates to prevent etching of the (211) plane. In addition to the anisotropic etchant described above, an etchant consisting of 3 parts of hydrazine hydrate and 1 part of isopropyl alcohol at a temperature of 90° C. to 95° C. may be used. Reference may be made to Journal of the Electrochemical Society, April 1975, pages 545 to 552.

Where the mask layer 65 is formed to cover all of portions 63 the semiconductor layer 66 would be formed having a bottom, i.e., region 60 determined by the mask layer 61 and four side surfaces, the width thereof decreasing toward the upper surface. These four side surfaces coincide with the (111) planes described above, and the anisotropic etching is stopped at these surfaces. Since the side surfaces of the semiconductor layer 66 are (111) planes they incline by 54° with respect to the major plane 51.

When forming the semiconductor layer in a manner described above, the portion to be etched off is defined along the (111) plane inherent to the crystalline structure of the semiconductor layer so that it is not necessary to precisely align the position of the mask layer 61. The portion of the region 100 thus removed contains a relatively large number of crystal defects and hence is not suitable to be used as a region for forming the semiconductor elements.

Then the mask layer 65 alone is removed from above the layer 66 with dilute fluoric acid or an etchent containing a hydrofluoric acid. Also $SiO_2$ 61C on the upper surface of the first mask layer is etched to expose $Si_3N_4$ 61b and the mask layer 61 becomes a mask layer 61'. Thereafter, an N type impurity is diffused into the outer surface of layer 66 to form an N+ type semiconductor region 69 having an impurity concentration of $1 \times 10^{20}/cm^3$ and a thickness of 1 micron. The thickness of this semiconductor region 69 is increased to about 15 microns by subsequent heat treatment. Doping of the N+ type impurity does not require any photoetching step and so called self alignment is sufficient for this purpose, thus forming a low resistance layer indispensable to the improvement of the characteristic of transistors. When the impurity is deeply diffused the depletion layer of the base-collector junction reaches this low resistance layer under a low bias voltage thus decreasing the breakdown voltage. In this case, the semiconductor region 69 is also formed in the bottom portion of the semiconductor layer on the semiconductor substrate 53 to slightly extend below the mask layer 61'.

Then the assembly is subjected to an ordinary heat oxidation treatment at a temperature of 1050° C. for about 100 minutes to form an insulating film 70 consisting of an oxide film having a thickness of 0.8 micron on the outer surface of the region 69. At this time, although a thin oxide film is also formed on the mask layer 61', it is not shown.

Figure 2G:
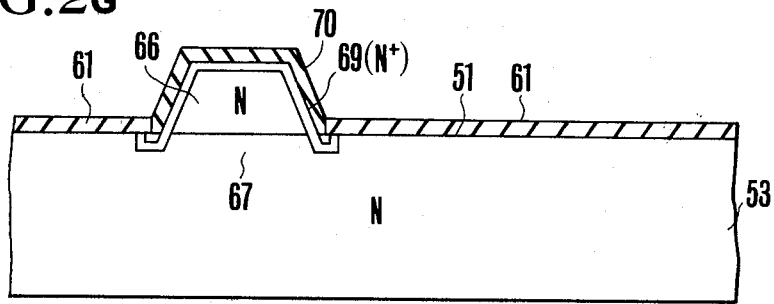
Figure 2H:
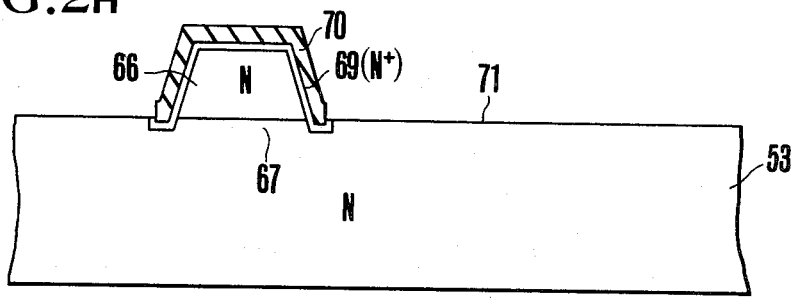
Figure 2I:
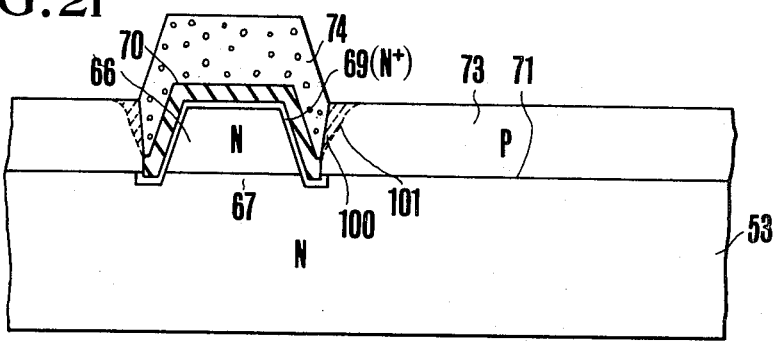

Then the mask layer 61' is etched off. In other words, Si$_3$N$_4$ is etched with hot phosphoric acid and SiO$_2$ layer 61a of 500 Angstroms is etched with dilute fluoric acid. As above described, the mask layer 61' includes a nitride film 61b in addition to an oxide film 61a. The ratio of etching speed of the nitride film and the oxide film is 1000:1 or more for the same etching solution, for example hot phosphoric acid at a temperature of 160° C. Thus only the mask layer 61' is selectively removed using hot phosphoric acid and dilute fluoric acid without any photolithographic step from the major plane 51 of FIG. 2G to become as shown in FIG. 2H. It should be noted that it is possible to effect selective etching without using any particular photolithographic step thereby simplifying the manufacturing steps of the semiconductor device.

As a consequence, the major plane of the semiconductor substrate 53 is exposed except a projection covered by the insulating layer 70, thus forming a exposed region 71. Under these conditions, an epitaxial layer 73, 74 containing such P type impurity as boron at a concentration of $7 \times 10^{14}$/cm$^3$ is formed on the semiconductor substrate 53 to a thickness of 70 microns. The epitaxial layer thus formed on the major plane region 71 from which the mask layer 61 has been removed is grown from a single crystalline layer so that the layer comprises an epitaxially grown layer. Furthermore, since the base of the epitaxial layer 74 formed on the projected insulating layer 70 is in contact therewith, the layer 74 comprises a polycrystalline layer. When these layers 73 and 74 are formed, the interface region 100 and the interface 101 are formed therebetween as shown in FIG. 2C.

Figure 2J:
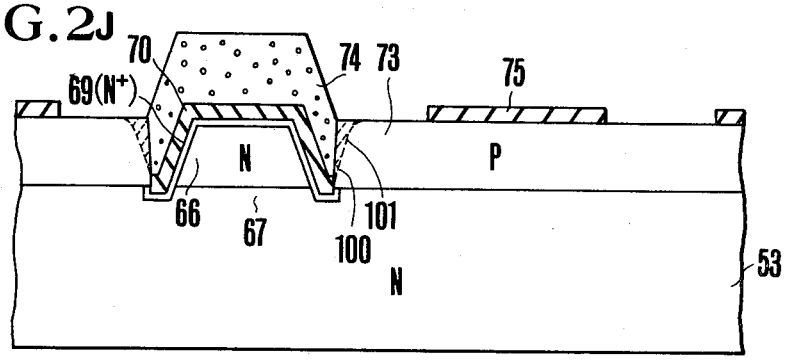

Then as shown in FIG. 2J, a silicon oxide film 75 having a thickness of 5000 A and a dimension of 200×200 microns, for example, is formed on a portion of the single crystalline epitaxially grown layer 73. This silicon oxide film 75 is formed about 70 microns apart from the skirt of the polycrystalline layer 74. This spacing is generally determined by the size of a groove formed by the subsequent anisotropic etching treatment. However, it is not necessary to strictly limit this spacing.

Figure 2K:
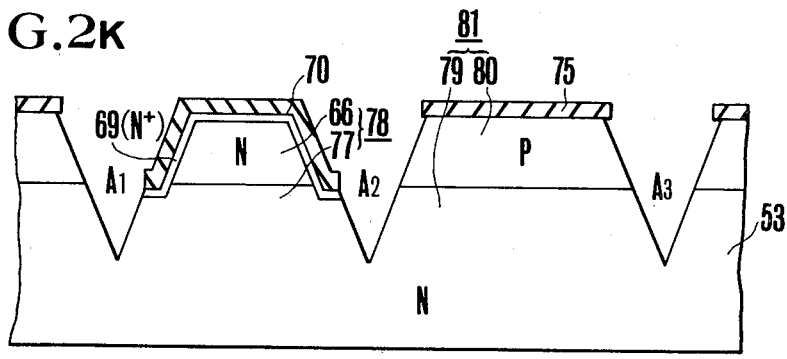

By using the mask layer 75, the layer 73 and the substrate 53 are anisotropically etched in the direction of thickness to form V shaped grooves A$_1$, A$_2$ and A$_3$ at portions not masked as shown in FIG. 2K. The layer 74 is all etched at this stage. The etchant used at this time is the same anisotropic etchant utilized in the step shown in FIG. 2E. The resulting grooves A$_1$, A$_2$ and A$_3$ have a depth of 13 microns measured from the surface of the remaining single crystalline epitaxial layer 73, i.e., layer 80. The inclined surfaces of the groove are exposed on the (111) plane of the crystal and make about 54° with respect to the major plane of the semiconductor.

As a result of forming the grooves A$_1$, A$_2$ and A$_3$, there are formed a semiconductor layer 78 comprising the layer 66 overlying the semiconductor layer 77 and another semiconductor layer 81 comprising a semiconductor layer 80 in a region 79 of the substrate 53 not covered by the insulating layer 70, as shown in FIG. 2K. Thus, by the etching treatment, working of the semiconductor layer 81 and forming of the isolating grooves are simultaneoulsy accomplished. Due to the anisotropic etching described above, the side walls of the isolating grooves make an angle of 54° with respect to the major plane 71. In other words, according to this invention, the side walls of both P and N type semiconductor layers 66 and 80 make an angle of about 54° with respect to the major plane 51 thus making it easy to anticipate correct amount of polishing and etching which characterizes the dielectriclly isolated integrated circuit.

Figure 2L:
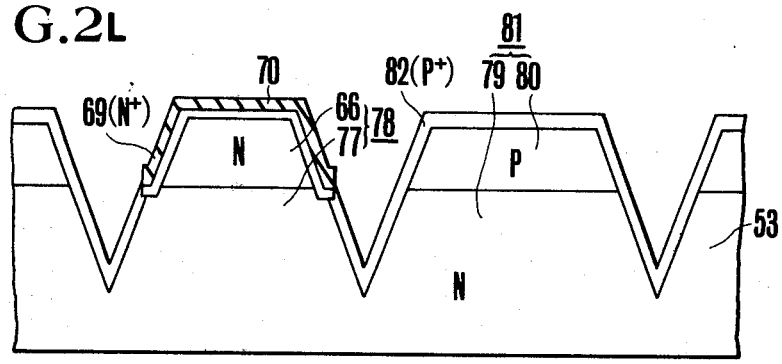

Then, by using the difference in the thicknesses of the insulating layers 70 and 75, the mask layer 75 is removed from the layer 81 by etching the entire surface without undergoing a photolithographic step. Then as shown in FIG. 2L, by diffusing a P$^+$type impurity, a semiconductor layer 82 having a P$^+$type impurity concentration of around $1 \times 10^{20}$/cm$^3$ and a thickness of about one micron is formed on the region of the layer 78 not covered by the insulating layer 70 and on the outside of the semiconductor layer 81. The thickness of this semiconductor layer 82 is increased to about 12 microns by a subsequent step. Like the aforementioned N$^+$type layer, this layer is also formed by self aligning technique.

Figure 2M:
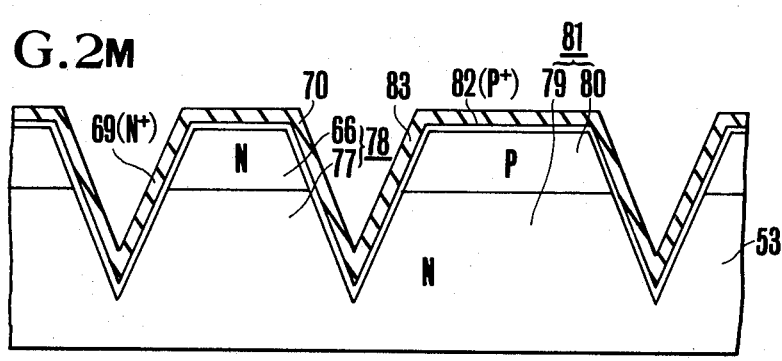

Then the assembly is subjected to a heat oxidizing treatment at 1050° C. to form an insulating layer 83 on the outer surface of the semiconductor layer 82, as shown in FIG. 2M.

Figure 2N:
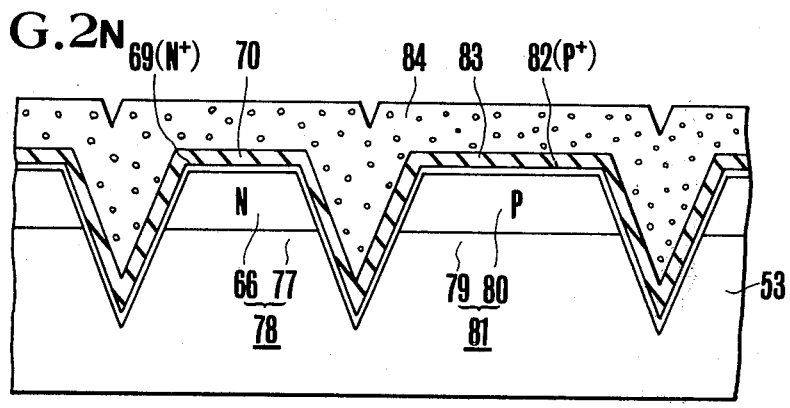

Then, a non-doped polycrystalline continuous silicon semiconductor layer 84 having a thickness of about 200 microns is formed on the insulating layers 70 and 83 as shown in FIG. 2N.

Figure 2O:
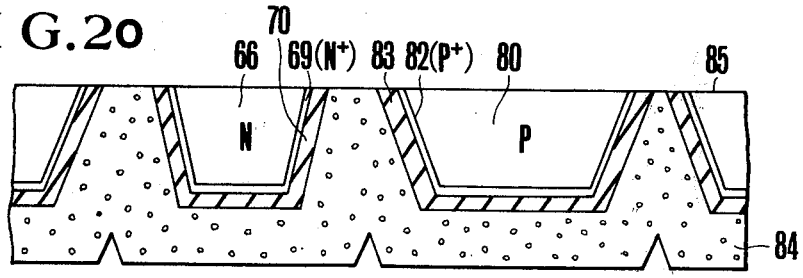

Then the portions of the assembly on the sides of the major plane 52 of the substrate 53 are polished and etched to form a major plane 85 obtained by cutting away the layer 77 of the semiconductor layer 78, the layer 79 of the semiconductor layer 81 and the insulating layer 83 along a plane parallel with the major plane 51, as shown (inverted relative to FIG. 2N) in FIG. 2O. The depth of regions 66 and 80 after cutting away is about 45 microns and about 65 microns respectively.

Thus, the N type epitaxially grown layer 66 and the P type epitaxially grown layer 80 have frustum shapes with their side surfaces and major planes intersect each other at an angle of about 54°. The side surfaces and the bottom surfaces are respectively formed with diffused layers 69 and 82, and the side surfaces and the bottoms of the layers 66 and 80 are respectively supported by the polycrystalline layer 84 through insulating layers 70 and 83.

With above described construction of this invention, since the angle subtended by the side walls and the major planes of the islands 66 and 80 each consisting of epitaxially grown layers is determined by the crystal structure which is about 54° as that obtained by epitaxially passivated integrated circuit technique, it is possible to evaluate a exact amount of polishing thus improving the yield. Moreover, it is possible to greatly decrease the values of series resistances of the semiconductor elements formed in the islands by the diffused layers on the bottom and side surfaces, thus improving the characteristics of the elements. According to the method of this invention, since the semiconductor layers 66 and 80 are formed by usual epitaxial process, not by the selective epitaxial process, not only precise control of the process is unnecessary, but also the thickness can be easily increased.

A method of manufacturing a complex semiconductor device will now be described in terms of a PNP transistor and an NPN transistor.

Figure 2P:
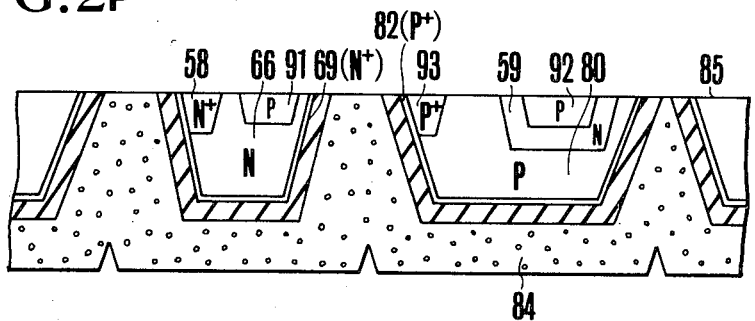

At first, by diffusing an N type impurity, a high concentration N type contact region 58 and an N type base region 59 are formed in the layers 66 and 80 respectively, as shown in FIG. 2P.

Then by locally diffusing a P type impurity, through the major plane 85, a P type base region 91 and a P type emitter region 92 are formed respectively in the layer 66 and in the region 59 in the layer 80 simultaneously with a P+ type contact region 93 in the layer 80 contiguous with the layer 82, as shown in FIG. 2P.

Depending upon the type of the impurity, concentration thereof and the diffusing temperature, diffusion of the P type impurity may be performed before the diffusion of the N type impurity.

Figure 2Q:
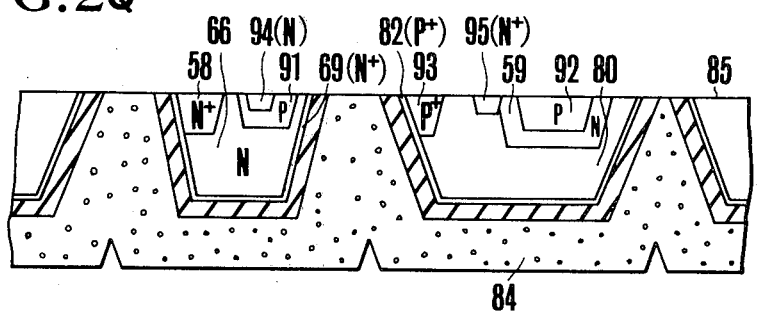

Then, as shown in FIG. 2Q, the N type impurity is diffused to form an N type emitter region 94 in the region 91 and an N type base contact region 95 contiguous with the region 59 in the layer 80 of the layer 81.

Figure 2R:
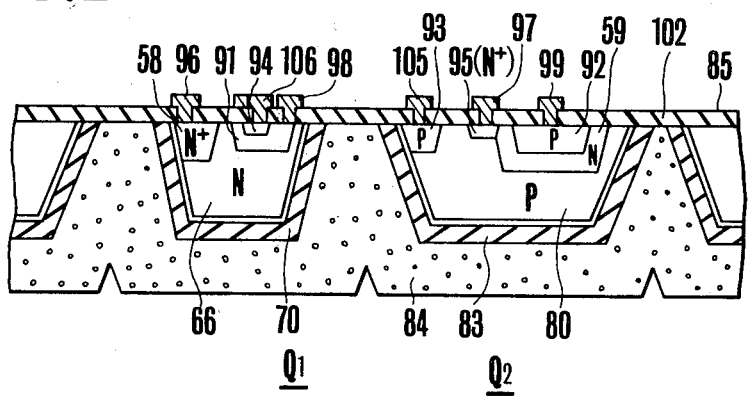

Then, as shown in FIG. 2R, electrodes 96, 97, 98, 99, 105, and 106 are attached to the regions 58, 95, 91, 92, 93, and 94 respectively, to obtain the desired complex semiconductor device. In FIG. 2R, 102 designates an insulating layer overlying the major plane 85 and applied before the electrodes are attached to their respective regions.

In the complex semiconductor device shown in FIG. 2R, there are provided a vertical NPN type bipolar transistor Q1 with collector, base and emitter regions respectively, constituted by the layers 66 and regions 91 and 94, and a vertical PNP type bipolar transistor Q2 with collector, base and emitter regions respectively constituted by the layer 80, regions 59 and 92, the two transistors being separated from each other by insulating layers 70 and 83. As can be clearly noted from the foregoing description, since the crystal structure of the semiconductor layers 66 and 80 in which the transistor Q1 and Q2 are formed is excellent and moreover since both PNP and NPN transistors have vertical structure the current amplification factors of both transistors can be improved. Moreover, since the semiconductor layers 66 and 80 in which transistors Q1 and Q2 are formed by epitaxial growth, it is possible to increase their resistivity, thus increasing the breakdown strength of the elements.

Figure 3:
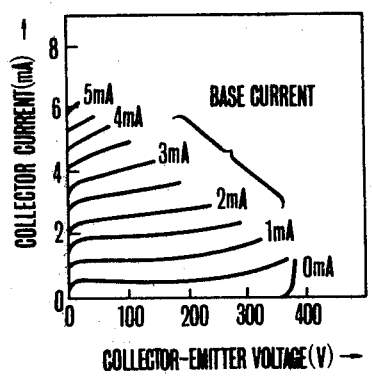
FIGS. 3 and 4 are diagrams showing the relationship between the collector-emitter voltage and the collector current of the NPN and PNP transistors fabricated by the method of this invention.
Figure 4:
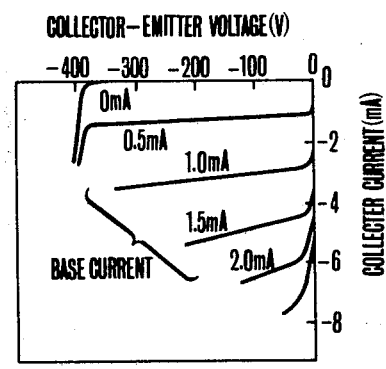

These excellent characteristics are shown by the result of experiment. Thus, FIG. 3 is a graph showing the relationship between the collector-emitter voltage and the collector current of transistor Q1. The conditions of manufacturing are as follows: the depth of the semiconductor layer 66–45 microns; a plane size—300×300 microns; the depth of the emitter electrode—7 micron; impurity concentration of the emitter—$1 \times 10^{20}/cm^3$; and the impurity concentration of the collector pocket 66—$5 \times 10^{14}/cm^3$. FIG. 4 is a graph showing the relationship between the collector—emitter voltage and the collector current of transistor Q2 manufactured under the following conditions: the N type impurity concentration in the semiconductor layer 66 used—$5 \times 10^{14}/cm^3$; the depth of the semiconductor layer 80-65 microns; a plane size—300×300 microns; the depth of the emitter electrode is 8 microns and its impurity concentration is $2 \times 10^{19}/cm^3$; the depth of the base electrode 59 is 11 microns and its impurity concentration is $8 \times 10^{18}/cm^3$; and the impurity concentration of the collector pocket is $7 \times 10^{14}/cm^3$.

As can be noted from the graphs shown in FIGS. 3 and 4, the breakdown strength of the PNP and NPN transistors utilizing the semiconductor substrate of this invention is extremely high, for example 350–380 V. It is also possible to make the series resistance of both elements to be less than several hundreds ohms which should be compared with a high resistance of the order of 1 K ohms where the side walls of the islands are not provided with any diffused layer.

Figure 5A:
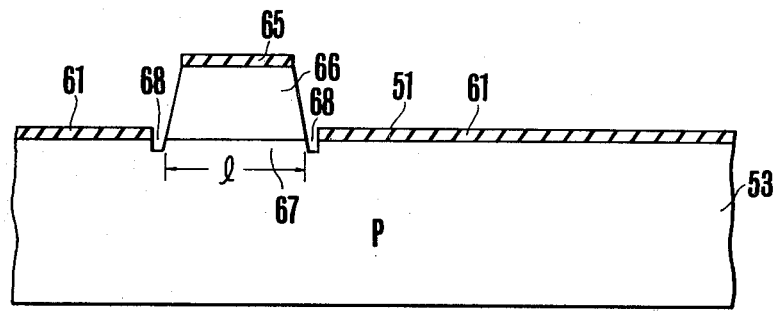
FIGS. 5A, 5B, 6 and 7 are sectional views showing modified embodiments of the semiconductor device according to this invention.
Figure 5B:
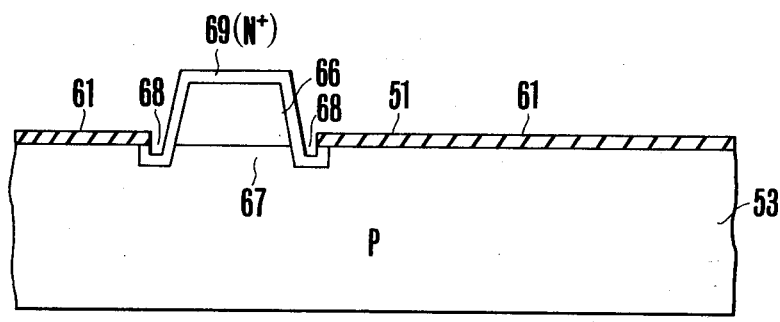

It should be understood that the invention is not limited to the specific embodiments described above and that numerous modifications may be made. For example, the mask layer disposed on the region 60 in the step of FIG. 2D may be made slightly narrower, i.e., to be 210×210 microns. With this narrow mask, a portion of the major plane of the substrate 53 would expose between the mask layer 61 and the layer 66 to form grooves 68, this state being shown in FIG. 5A. In this modification, the following steps are performed. Thus, an N+ type diffused layer 69 is formed on the substrate 53 including exposed grooves 68 as shown in FIG. 5B. The succeeding steps are equal to the steps shown in FIG. 2G and succeeding drawings.

The dimension of the mask utilized at this time is determined as follows: In FIG. 2D, let us denote the thickness of the layer 62 by d, the length of one side of the mask 61 (i.e., the width of an island) by l, the angle with respect to the major plane of the semiconductor substrate as determined by the crystal structure thereof by θ (the angle of the (111) plane with respect to the (100) crystal surface is 54°), the width of the top surface of the single crystal in the layer 62 by S, and the width of the mask utilized at the time of the anisotropic etching by α, then where α ≧ S, $$S + 2 \times d/\tan \theta = l$$

For this reason, it is not necessary to limit the width α of the mask unless it contacts that of the adjacent island, because in the polycrystalline portion 64 and the single crystalline portion 100 containing defects, the etching proceeds even beneath the mask if an anisotropic etchant is used.

However, when α < S, $$\alpha + 2 \times d/\tan \theta = l$$

Furthermore, the complementary semiconductor elements formed in respective islands are not limited to bipolar transistors, but may be thyristors, field effect transistors, etc.

Figure 6:
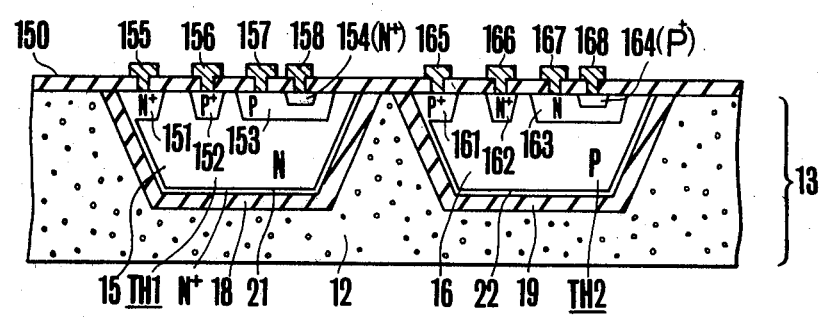

FIG. 6 shows one example wherein thyristors are incorporated into islands. More particularly, a PNPN thyristor TH1 is formed in the island 15. This thyristor TH1 comprises an N+ type region 151 contiguous with the N+ region 21, a P+ region 152, a P region 153, an N+ region 154 forms in the P region 153, a gate electrode 155 in contact with the N+ region 151, gate electrode 155, an anode electrode 156 in contact with the P+ region 152, a gate electode 157 in contact with the P region, and a cathode electrode 158 in contact with the N+ region 154.

An NPNP type thyristor TH2 is formed in the island 16 on a supporting substrate 12. This thyristor comprises a P+ region 161 contiguous with the region 22 adjacent the insulating region 19, an N+ region 162, an N region 163, a gate electrode 165 in contact with the P+ region 161, a cathode electrode 166 in contact with the N+ region 162, an gate electrode 167 in contact with the N region, and a anode electrode 168 in contact with the P+ region 164. 150 designates an insulating film overlying both thyristers.

Since the operation and characteristic of these thyristers TH1 and TH2 are well known it is believed unnecessary to describe them in detail.

Figure 7:
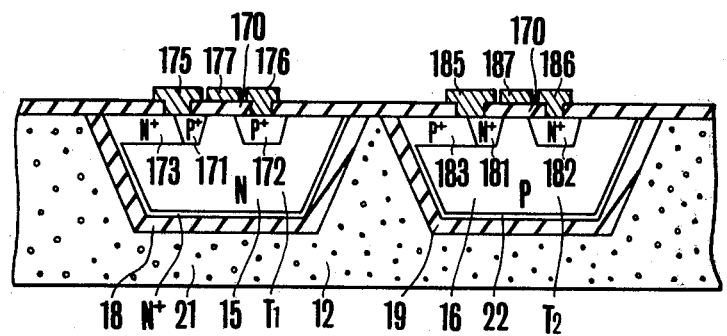

FIG. 7 shows a modification in which complementary field effect transistors are incorporated into the islands 15 and 16.

More particularly, in the island 15 is formed a P channel field effect transistor T1 comprising a P+ source and drain regions 171 and 172, an N+ region 173 connecting the source region 171 to the N+ region 21, a source electrode 175 in contact with the regions 171 and 173, a drain electrode 176 in contact with the region 172, and a gate electrode 177 disposed on an oxide film 170 between the source and drain regions 171 and 172.

Similarly, in the island 16 is formed a N channel field effect transistor T2 comprising N+ source and drain regions 181 and 182, a P+ region 183 connecting the source region 181 to the P+ region 22, a source electrode 185 in contact with the regions 181 and 183, a drain electrode 186 in contact with the region 182, and a gate electrode 187 mounted on the oxide film 170 interposed between source and drain regions 181 and 182. The operation and characteristics of these field effect transistors T1 and T2 are well known in the art.

What is claimed is:

1. A method of manufacturing a compound semiconductor device comprising the steps of:
    applying a first mask layer onto one major surface of a semiconductor substrate except a first local region, said first mask layer having an upper layer and a lower layer of the same material and an intermediate layer of a different material having a first etching speed;
    forming a first semiconductor layer of a first conductivity type on the entire surface of said substrate by an epitaxial growth process, said first semiconductor layer including a single crystalline layer grown from said first local region of said semiconductor substrate, and a polycrystalline layer grown from said first mask layer;
    forming a second mask layer of said same material on a portion of said first semiconductor layer corresponding to said first local region, said second mask layer being etchable by a solution which barely etches said intermediate layer and being substantially thicker than said lower layer of said first mask layer;
    etching said first semiconductor layer by using said second mask layer so as to leave only said single crystalline layer having inclined surfaces determined by a crystal structure of said single crystalline layer;
    removing said second mask layer;
    forming a layer containing an impurity of the first conductivity type at a high concentration over the entire outer surface of said single crystalline layer;
    forming a first insulating layer on said single crystalline layer;
    removing said first mask layer;
    forming a second semiconductor layer of a second conductivity type over the entire surface of the substrate by epitaxial growth process, said second semiconductor layer including a polycrystalline layer grown from said first insulating layer and a single crystalline layer grown from said semiconductor substrate;
    selectively forming a third mask layer on the single crystalline layer of the second semiconductor layer;
    etching said second semiconductor layer by using said third mask layer so as to leave a single crystalline layer of the second semiconductor layer on a second local region of the semiconductor substrate thereby forming inclined surfaces determined by crystal structure of said semiconductor substrate;
    removing said third mask layer;
    forming a layer containing at a high concentration an impurity of the second conductivity type on the entire outer surface of the remaining single crystalline layer of said second semiconductor layer and exposed surface of said substrate;
    forming a second insulating layer on a surface containing the remaining single crystalline layer of said second semiconductor layer and exposed surface of said substrate;
    forming a polycrystalline semiconductor layer on said surfaces of said first and second insulating layers;
    removing said semiconductor substrate; and
    forming semiconductor elements having complementary characteristics in respective exposed single crystalline layers by utilizing a surface formed by polishing as a major plane.

2. The method according to claim 1 wherein said step of removing said semiconductor substrate includes a step of cutting away the single crystalline layers of the first and second semiconductor layers in parallel with the major plane of said semiconductor substrate.

3. The method according to claim 1 or 2 wherein said semiconductor substrate comprises silicon.

4. The method according to claim 3 wherein said intermediate film having said first etching speed of said first film layer comprises a silicon nitride film, and wherein said upper and lower mask layers comprise silicon oxide films.

5. The method according to claim 1 or 2 wherein each mask layer has a substantially square shape.

* * * * *